United States Patent [19]

Nakao

[11] Patent Number: 5,216,279
[45] Date of Patent: Jun. 1, 1993

[54] POWER SEMICONDUCTOR DEVICE SUITABLE FOR AUTOMATION OF PRODUCTION

[75] Inventor: Junichi Nakao, Hyogo, Japan

[73] Assignee: Kabushiki Kaisha Toshiba, Kawasaki, Japan

[21] Appl. No.: 736,230

[22] Filed: Jul. 26, 1991

[30] Foreign Application Priority Data

Jul. 26, 1990 [JP] Japan .................................. 2-196330

[51] Int. Cl.⁵ ...................... H01L 39/02; H01L 23/02
[52] U.S. Cl. .................................. 257/712; 257/690; 257/703; 361/388
[58] Field of Search ..................... 357/80, 81; 361/388

[56] References Cited

U.S. PATENT DOCUMENTS

| 3,994,430 | 11/1976 | Cusano et al. | 228/122 |
| 4,518,982 | 5/1985 | DuBois et al. | 357/74 |
| 5,012,324 | 4/1991 | Martin et al. | 357/81 |
| 5,012,387 | 4/1991 | Ohlenburger | 361/388 |
| 5,038,198 | 8/1991 | Spatrisano et al. | 357/81 |

FOREIGN PATENT DOCUMENTS

| 144866 | 6/1985 | European Pat. Off. |
| 153618 | 9/1985 | European Pat. Off. |
| 170022 | 2/1986 | European Pat. Off. |
| 181975 | 5/1986 | European Pat. Off. |
| 3922485 | 6/1990 | Fed. Rep. of Germany |

OTHER PUBLICATIONS

"A New Hybrid Power Technique Utilizing a Direct Copper to Ceramic Bond", IEEE Transactions on Electron Devices, vol. ED-23, No. 8, Aug. 1976, Y. S. Sun et al, pp. 961-967.

Primary Examiner—Rolf Hille
Assistant Examiner—David Ostrowski
Attorney, Agent, or Firm—Oblon, Spivak, McClelland, Maier & Neustadt

[57] ABSTRACT

The feature of the construction of this invention lies in a direct bond copper (DBC) pate. That is, a first Cu plate on which a semiconductor pellet is formed is fixed on the ceramic plate to continuously extend from the front surface of the ceramic plate to the rear surface thereof via one side surface thereof. Second Cu plates serving as electrodes of the semiconductor pellet are fixed on both sides of the Cu plate on the surface of the ceramic plate on which the semiconductor pellet is disposed. Electrode pads formed on the semiconductor pellet fixed on the first Cu plate are electrically connected to the second Cu plates by means of bonding wires. Since the the first Cu plate is continuously formed on the rear surface of the ceramic plate which is opposite to the surface on which the semiconductor pellet is mounted, the fixation surface of the semiconductor pellet is electrically connected to a heat sink plate.

9 Claims, 3 Drawing Sheets

POWER SEMICONDUCTOR DEVICE SUITABLE FOR AUTOMATION OF PRODUCTION

BACKGROUND OF THE INVENTION

1. Field of the Invention

This invention relates to a power semiconductor device having a large pellet size and used for motor control or the like.

2. Description of the Related Art

In a power semiconductor module, the technique utilizing the direct bonding of copper to ceramic is disclosed in, for example, U.S. Pat. No. 3,994,430 and IEEE TRANSACTIONS ON ELECTRON DEVICES, VOL. ED-23, NO. 8, AUGUST 1976, p 964, "A New Hybrid Power Technique Utilizing a Direct Copper to Ceramic Bond".

In the power semiconductor module utilizing the above technique, a built-in device is fixed on a plate called a direct bond copper (DBC) plate and constituted by directly attaching copper (Cu) to a ceramic plate. A heat sink is fixed on the rear surface of the DBC plate which is the opposite surface of the fixing surface of the device. With this construction, the number of manufacturing steps and the number of parts used can be reduced.

FIG. 1 is a perspective view of a conventional DBC plate fixed on a heat sink. A heat sink 1 may be formed of a Cu plate plated with nickel or aluminum plate, for example. A DBC plate 2 is fixed on the heat sink 1. The DBC plate 2 has a Cu plate 4 which is fixed on the surface of a ceramic plate 3 and on which a semiconductor pellet (not shown) is mounted and Cu plates 5 used as electrodes of the semiconductor pellet and fixed on the surface of the ceramic plate. The ceramic plate 3 and the Cu plates 4 and 5 are fixed together in a high-temperature oxidation atmosphere, for example. Although not shown in FIG. 1, a Cu plate is also fixed on the rear surface of the ceramic plate 3.

The DBC plate 2 is fixed on the heat sink 1 by soldering, for example. The ceramic plate 4 which is insulative is disposed between the Cu plate 4 and the heat sink 1. In a case where a product requiring that the Cu plate 4 on which the semiconductor pellet is disposed and the heat sink 1 are electrically connected is manufactured, a terminal metal member 6 is formed. The terminal metal member 6 is bonded at one end to the Cu plate 4 and bonded at the other end to the heat sink 1. With this connection, the Cu plate 4 on which the semiconductor pellet is disposed is electrically connected to the heat sink 1.

However, mounting of the terminal metal member 6 makes it difficult to attain automation of the mass-production line. First, it is difficult to use the mass-production line together with a mass-production line in which mounting of the terminal metal member 6 is not necessary. Secondly, enhancement of the mass-productivity is prevented by the adhesive quality and the precision of the mounting position of the terminal metal member 6.

SUMMARY OF THE INVENTION

Accordingly, an object of this invention is to provide a power semiconductor device capable of reducing the number of parts used and the number of manufacturing steps and attaining automation of an assembling line.

The above object can be attained by a power semiconductor device suitable for automation of production, comprising:

a ceramic-series insulative plate;

a first conductive plate fixed on the ceramic-series insulative plate to continuously extend from the front surface of the ceramic-series insulative plate to the rear surface thereof via one side surface thereof;

second conductive plates fixed on both sides of the first conductive plate on the surface of the ceramic-series insulative plate;

a semiconductor pellet fixed on the first conductive plate;

wiring means for connecting electrode pads formed on the semiconductor pellet to the second conductive plates; and a heat sink plate fixed on that portion of the first conductive plate which is formed on the rear surface of the ceramic-series insulative plate which is opposite to the surface on which the semiconductor pellet is disposed.

In this invention, since the conductive plate on which the semiconductor pellet is mounted is fixed on the ceramic-series insulative plate to continuously extend from the front surface of the ceramic-series insulative plate to the rear surface thereof via one side surface thereof, the number of manufacturing steps can be significantly reduced. Further, since the heat sink to be fixed in the later manufacturing step is electrically connected to the semiconductor pellet without using an additional part, mass-production can be easily and efficiently attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

There will now be described an embodiment of this invention with reference to the accompanying drawings.

Figure 1:
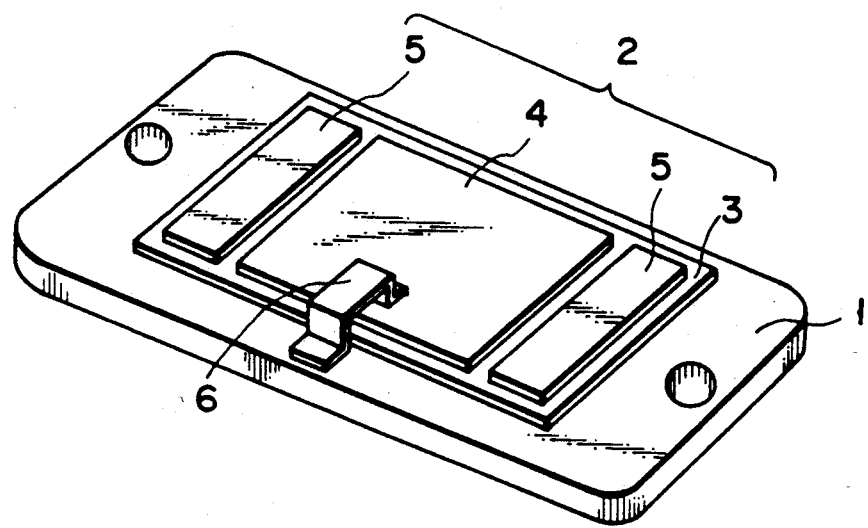
FIG. 1 is a perspective view showing the construction of a conventional DBC plate.
Figure 2A:
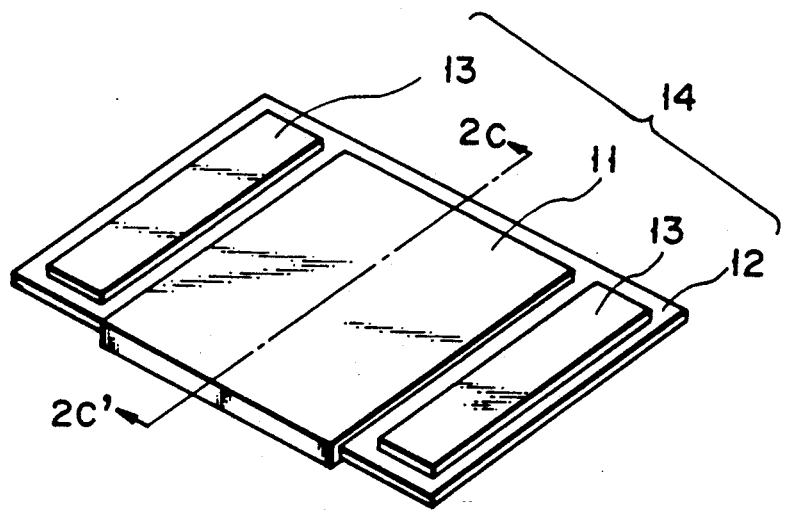
FIGS. 2A and 2B are perspective views showing the construction of a DBC plate according to one embodiment of this invention.
Figure 2B:
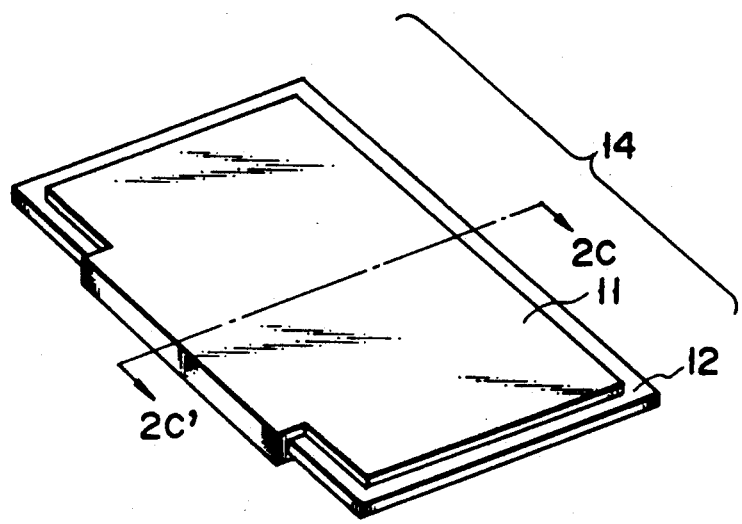
Figure 2C:
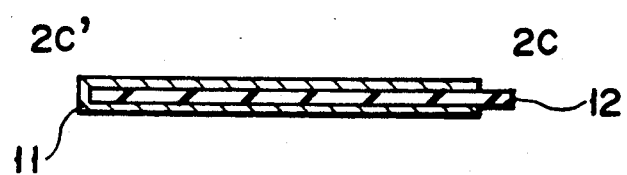
FIG. 2C is a cross sectional view taken along the line 2C-2C' of FIG. 2A.

FIGS. 2A and 2B are perspective views showing the construction of a DBC plate according to one embodiment of this invention. FIG. 2A shows the surface (front surface) of the plate on which a semiconductor pellet is disposed and FIG. 2B shows the surface (rear surface) of the plate on which a heat sink is fixed. FIG. 2C is a cross sectional view taken along the line 2C–2C' of FIG. 2A.

A Cu plate 11 on which a semiconductor pellet (not shown) is disposed is fixed on a ceramic plate 12 to continuously extend from the front surface of the plate 12 to the rear surface thereof via one side surface thereof. Cu plates 13 serving as electrodes of a semiconductor pellet (not shown) are disposed on both sides of the Cu plate 11 on the surface of the ceramic plate 12 on which the semiconductor pellet is disposed. For example, the ceramic plate 12, Cu plates 11 and 13 are fixed together in a high-temperature oxidation atmosphere. Thus, a DBC plate 14 is formed.

With the construction of the above embodiment, the Cu plate 11 is formed in a "letter-U" shape as shown in FIG. 2C, and the ceramic plate 12 is inserted into the groove defined by the "U"-shaped plate. Thus, the DBC plate 14 can be made simple in construction, can be easily fixed, and has a high degree of heat conduction from the front to the rear surface.

Figure 3:
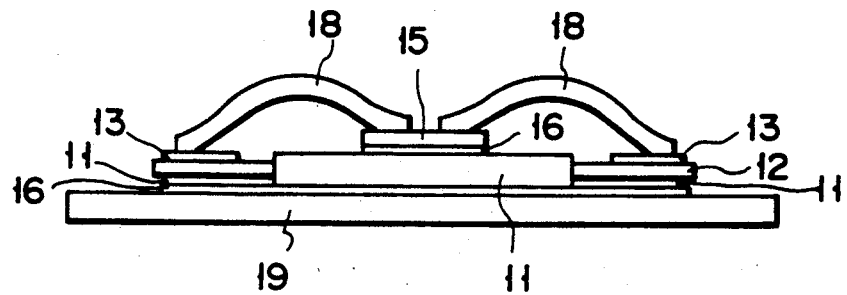
FIG. 3 is a side view showing the construction of a power semiconductor device manufactured by use of the DBC plate shown in FIGS. 2A to 2C.
Figure 4:
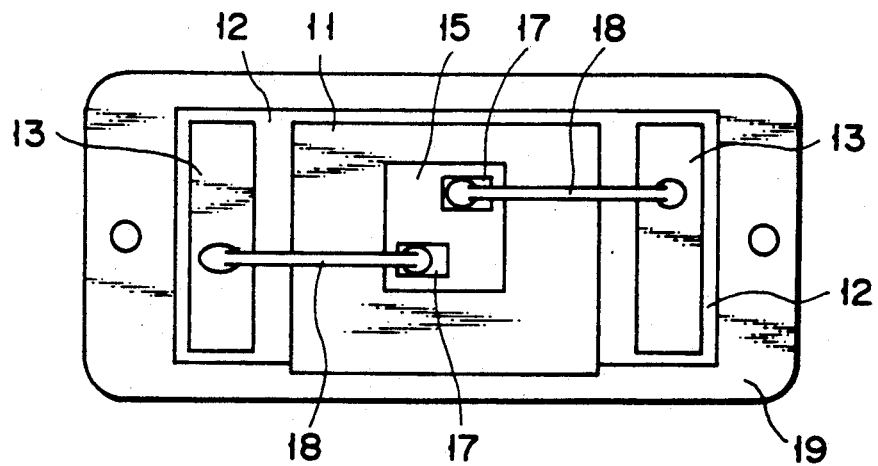
FIG. 4 is a top plan view of the power semiconductor device of FIG. 3.

FIG. 3 is a side view showing the construction of a power semiconductor module manufactured by use of the DBC plate 14 of the above construction. In this case, FIG. 3 shows the construction from which an external casing and external leads are omitted. A semiconductor pellet 15 is mounted on the Cu plate 11 by use of solder 16 or the like. The Cu plates 13 (electrodes) and electrode pads 17 on the semiconductor pellet 15 are electrically connected together via bonding wires 18 formed of aluminum.

The DBC plate 14 on which the semiconductor pellet 15 is mounted is fixed on a heat sink 19. In this case, since the Cu plate 11 is formed to continuously extend from the front surface of the insulative ceramic plate 12 to the rear surface thereof, the heat sink 19 and the DBC plate 14 can be electrically connected to each other by normal bonding using the solder 16 or the like.

In a case where the semiconductor pellet 15 is a bipolar transistor, the heat sink 19 and the Cu plate 11 connected to the collector of the transistor are electrically connected to each other. Therefore, the terminal metal member 6 becomes unnecessary.

According to the above embodiment, it is possible to provide an assembling line in which the number of assembling steps is reduced and which can be used together with a mass-production line in which mounting of the terminal metal member 6 is not necessary. As a result, the manufacturing cost can be reduced.

As described above, according to this invention, it is possible to provide a power semiconductor device in which the number of parts used can be reduced, the number of manufacturing steps can be reduced and automation of the assembling line can be easily attained by forming the Cu plate on which the semiconductor pellet is mounted to continuously extend from the front surface to the rear surface of the DBC plate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A power semiconductor device suitable for automation of production, comprising:
   a ceramic-series insulative plate;
   a U-shaped first conductive plate defining a groove in which said ceramic-series insulative plate is inserted, said U-shaped first conductivity plate continuously extending from the front surface of said ceramic-series insulative plate to the rear surface thereof via one side surface thereof;
   second conductive plates fixed on both sides of said first conductive plate on the surface of said ceramic-series insulative plate;
   a semiconductor pellet disposed on said U-shaped first conductive plate;
   wiring means for connecting electrode pads formed on said semiconductor pellet to said second conductive plates; and
   a heat sink plate fixed on that portion of said U-shaped first conductive plate which is formed on the rear surface of said ceramic-series insulative plate which is opposite to the surface of said U-shaped first conductive plate on which said semiconductor pellet is disposed.

2. A power semiconductor device according to claim 1, wherein said first and second conductive plates are conductive plates containing copper as a main component.

3. A power semiconductor device according to claim 1, wherein said first conductive plate is electrically connected to said heat sink plate.

4. A power semiconductor device according to claim 1, wherein said semiconductor pellet is a bipolar transistor having a base, an emitter and a collector, wherein the surface of said bipolar transistor fixed on said first conductive plate is said collector and said base and said emitter are connected to respective of said second conductive plates.

5. A power semiconductor device suitable for automation of production, comprising;
   a ceramic plate;
   a first copper plate fixed on said ceramic plate to continuously extend from the front surface of said ceramic plate to the rear surface thereof via one side surface thereof, said first copper plate having a fixation surface in contact with the front surface of said ceramic plate which is larger than a fixation surface of said first copper plate in contact with the rear surface of said ceramic plate;
   second copper plates fixed on both sides of said first copper plate on the surface of said ceramic plate;
   a semiconductor pellet disposed on said first copper plate;
   a bonding wire for connecting electrode pads formed on said semiconductor pellet to said second copper plates; and
   a heat sink plate fixed on that portion of said first copper plate which is formed on the rear surface of said ceramic plate which is opposite to the surface of the first copper plate on which said semiconductor pellet is disposed.

6. A power semiconductor device according to claim 5, wherein said first conductive plate is electrically connected to said heat sink plate.

7. A power semiconductor device according to claim 5, wherein said semiconductor pellet is a bipolar transistor and the surface thereof fixed on said first conductive plate is a collector.

8. A power semiconductor device according to claim 7, wherein said first conductive plate is electrically connected to said heat sink plate.

9. A power semiconductor device according to claim 5, wherein said semiconductor pellet is a bipolar transistor having a base, an emitter and a collector, wherein the surface of said bipolar transistor fixed on said first conductive plate is said collector and said base and said emitter are connected to respective of said second conductive plates.

* * * * *